US010755938B2

(12) United States Patent
Hung et al.

(10) Patent No.: US 10,755,938 B2
(45) Date of Patent: Aug. 25, 2020

(54) METAL GATE AND MANUFACTURING METHOD THEREOF

(71) Applicant: TAIWAN SEMICONDUCTOR MANUFACTURING COMPANY LTD., Hsinchu (TW)

(72) Inventors: Chi-Cheng Hung, Tainan (TW); Yu-Sheng Wang, Tainan (TW); Ting-Siang Su, Tainan (TW); Ching-Hwanq Su, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/996,789

(22) Filed: Jun. 4, 2018

(65) Prior Publication Data

US 2018/0286686 A1    Oct. 4, 2018

Related U.S. Application Data

(62) Division of application No. 14/671,053, filed on Mar. 27, 2015, now Pat. No. 9,991,124.

(60) Provisional application No. 62/105,554, filed on Jan. 20, 2015.

(51) Int. Cl.
| | | |
|---|---|---|
| *H01L 21/285* | (2006.01) | |
| *H01L 29/423* | (2006.01) | |
| *C23C 14/18* | (2006.01) | |
| *H01L 21/28* | (2006.01) | |
| *C23C 14/02* | (2006.01) | |
| *H01L 29/78* | (2006.01) | |
| *H01L 29/49* | (2006.01) | |
| *H01L 29/51* | (2006.01) | |
| *H01L 21/768* | (2006.01) | |

(52) U.S. Cl.
CPC ........ *H01L 21/2855* (2013.01); *C23C 14/025* (2013.01); *C23C 14/185* (2013.01); *H01L 21/28123* (2013.01); *H01L 29/42376* (2013.01); *H01L 21/76843* (2013.01); *H01L 29/4958* (2013.01); *H01L 29/4966* (2013.01); *H01L 29/513* (2013.01); *H01L 29/78* (2013.01)

(58) Field of Classification Search
None
See application file for complete search history.

(56) References Cited

U.S. PATENT DOCUMENTS

| | | | |
|---|---|---|---|
| 5,998,870 A | 12/1999 | Lee et al. | |
| 7,354,843 B2 * | 4/2008 | Yeo | H01L 27/0805 257/E21.008 |
| 2005/0051867 A1 * | 3/2005 | Lee | H01L 27/11 257/510 |
| 2013/0026578 A1 * | 1/2013 | Tsau | H01L 21/823842 257/368 |

(Continued)

*Primary Examiner* — Robert K Carpenter
(74) *Attorney, Agent, or Firm* — WPAT, P.C., Intellectual Property Attorneys; Anthony King

(57) ABSTRACT

The present disclosure provides a semiconductor structure, including an active region with a first surface; an isolated region having a second surface, surrounding the active region, the first surface being higher than the second surface; and a metal gate having a plurality of metal layers disposed over the first surface and the second surface. A ratio of a thinnest portion and a thickest portion of at least one of the plurality of metal layers is greater than about 40%.

20 Claims, 20 Drawing Sheets

(56) References Cited

U.S. PATENT DOCUMENTS

2013/0299916 A1   11/2013   Won et al.

* cited by examiner

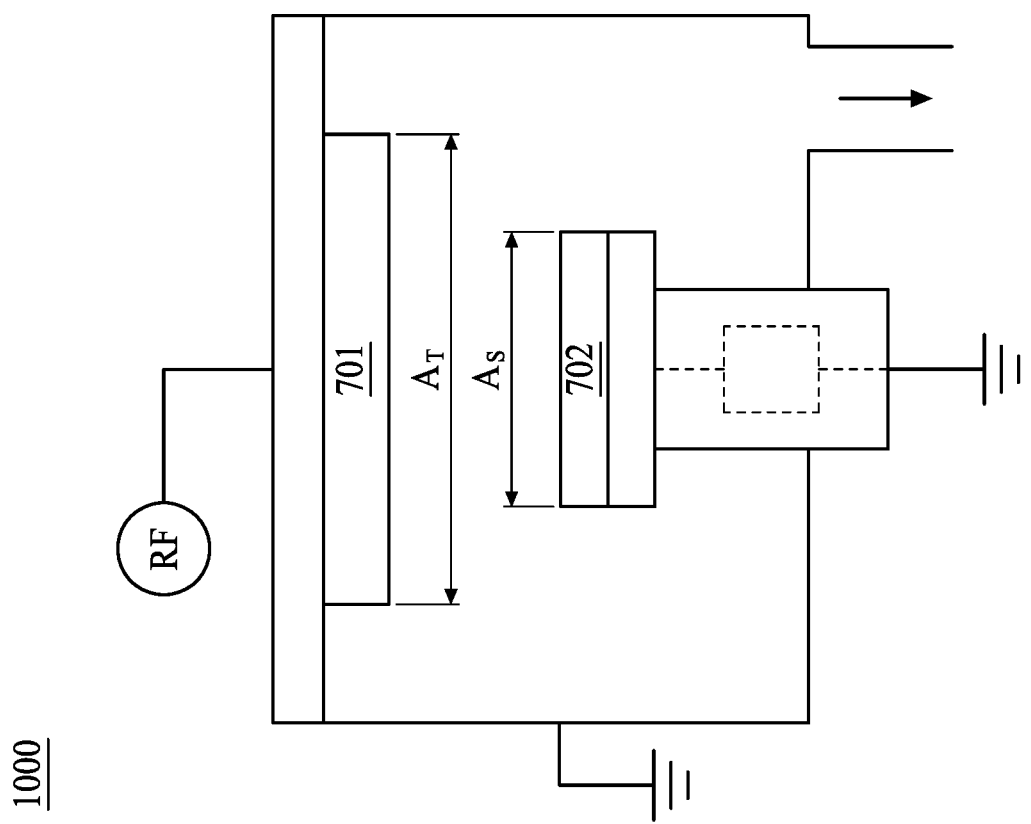

METAL GATE AND MANUFACTURING METHOD THEREOF

PRIORITY CLAIM AND CROSS-REFERENCE

This application claims the benefit of provisional application Ser. 62/105,554 filed on Jan. 20, 2015, entitled "METAL GATE AND MANUFACTURING METHOD THEREOF," and the application Ser. No. 14/671,053 filed on Mar. 27, 2015, entitled "METAL GATE AND MANUFACTURING METHOD THEREOF," the disclosure of which is hereby incorporated by reference in its entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed. As the dimensions of transistors decrease, the thickness of the gate oxide must be reduced to maintain performance with the decreased gate length. However, in order to reduce gate leakage, high dielectric constant (high-k) gate insulator layers are used which allow greater physical thicknesses while maintaining the same effective capacitance as would be provided by a typical gate oxide used in larger technology nodes.

Additionally, as technology nodes shrink, in some IC designs, there has been a desire to replace the typically polysilicon gate electrode with a metal gate (MG) electrode to improve device performance with the decreased feature sizes. One process of forming the MG electrode is termed "gate last" process, as opposed to another MG electrode formation process termed "gate first". The "gate last" process allows for reduced number of subsequent processes, including high temperature processing, that must be performed after formation of the gate.

Thus, what is desired is a method and semiconductor device providing differently configured metal gate structures for each of NMOS and PMOS transistors formed on a substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 10 is a cross sectional view of a sputtering chamber where a target and the semiconductor substrate have substantial identical surface areas.

DETAILED DESCRIPTION

Figure 1:
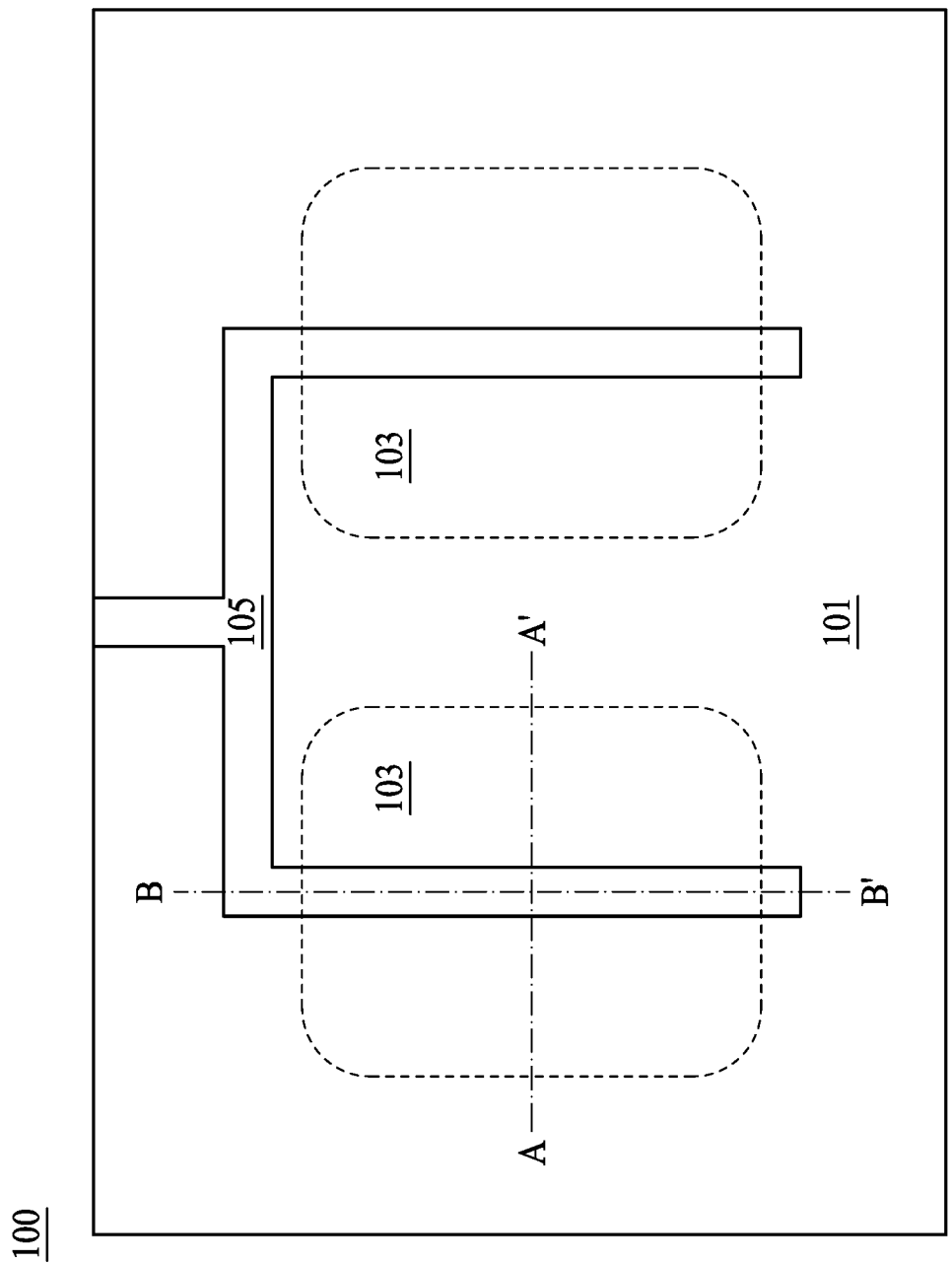
FIG. 1 is a top view layout of a semiconductor structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Atomic layer deposition (ALD), chemical vapor deposition (CVD), and physical vapor deposition (PVD) are conventional technologies that have been used to form metal gate structures. Among the afore-mentioned technologies, parameters of PVD operation may be more finely tuned and controlled (e.g. vertical and horizontal deposition rate). In addition, compared to CVD operation, metal films formed by PVD normally have better quality, lower impurity concentration, and lower resistivity. Sputtering is the dominant PVD operations in semiconductor fabrication because it can deposit high-purity, lower-resistivity metal film with excellent uniformity and reliability.

Despite the advantages of PVD technology, one unsatisfactory aspect of using PVD technology to form a metal layer is that PVD technology does not show satisfactory sidewall coverage compared to the CVD or ALD counterpart, and thus increases the chance of aluminum spiking. For example, in a conventional metal gate sputtering scheme, metal (most commonly aluminum—a Type III (P-type) dopant) has a tendency to alloy with underlying polysilicon during thermal annealing steps. This strong alloying tendency can create a short circuit between the diffused field effect transistor (FET) source or drain areas under the aluminum and across the metallurgical junction into the underlying substrate—causing irreparable circuit failures. These shorts are created by pyramidal-shaped spikes of silicon-aluminum alloy—pointing vertically "down" into an active region of the semiconductor substrate, and thus being termed as "aluminum spiking". In some embodiments, the term "active region" described herein includes areas of substrate functionally doped with various conductive dopants (such as source or drain) or area that is substantially undoped (such as channel).

One solution to prevent aluminum spiking from a metal gate is that various intermitting layers between the underlying substrate and the aluminum metal shall possess sufficient quality in order to effectively bar the aluminum from downward diffusion. Deposition of metal gate in a FET of 20 nm node and under faces a challenge of covering a "weak spot" of the underlying active region. In some embodiments, the "weak spot" referred herein appears to be a step having a height difference between a portion of the substrate and an isolated region surrounding said portion of the substrate. In some embodiments, the portion of the substrate being surrounded is the active region. As discussed previously, compared to CVD and ALD, uniform step coverage cannot be achieved by PVD under normal operational condition. When depositing intermitting layers over said step, the step coverage may not be sufficient to effectively block the aluminum from diffusing downward. In other words, the layer thickness at the top of the step may be well-controlled by appropriate sputtering conditions, while the layer thickness at the corner and/or at the sidewall of the step may not be well-controlled. Aluminum spiking is most frequently observed at the aforesaid "weak spot", lowering the device yield. In addition, from a perspective of a whole wafer, the area where the aluminum spiking being most frequently observed is at the wafer edge.

Some embodiments of the present disclosure show a semiconductor structure with improved metal gate coverage at the "weak spot". For example, a ratio of a thinnest portion and a thickest portion of one of the intermitting layers is greater than about 40%. Alternatively stated, the thickness uniformity of the intermitting layer can be improved, throughout the top surface, the corner, and the sidewall of the step, so as to block the aluminum from downward diffusion. Moreover, the present disclosure further discloses the method of forming the semiconductor structure with improved metal gate coverage at the "weak spot".

Referring to FIG. 1, FIG. 1 is a top view layout of a semiconductor structure 100, in accordance with some embodiments of the present disclosure. Semiconductor structure 100 includes, for example, two active regions 103, each surrounded by an isolated region 101. Two active regions 103 are separated by the isolated region 101 and are each overlaid by a gate stripe 105. In some embodiments, the left active region 103 is a PFET, and the right active region 103 is an NFET. In some embodiments, each active region 103 includes a source region, a drain region, and a channel region. The layout of the semiconductor structure 100 is illustrated as an example for the definition of an active region 103 on a semiconductor substrate, and shall not be considered as a limitation to any embodiments.

Figure 2:
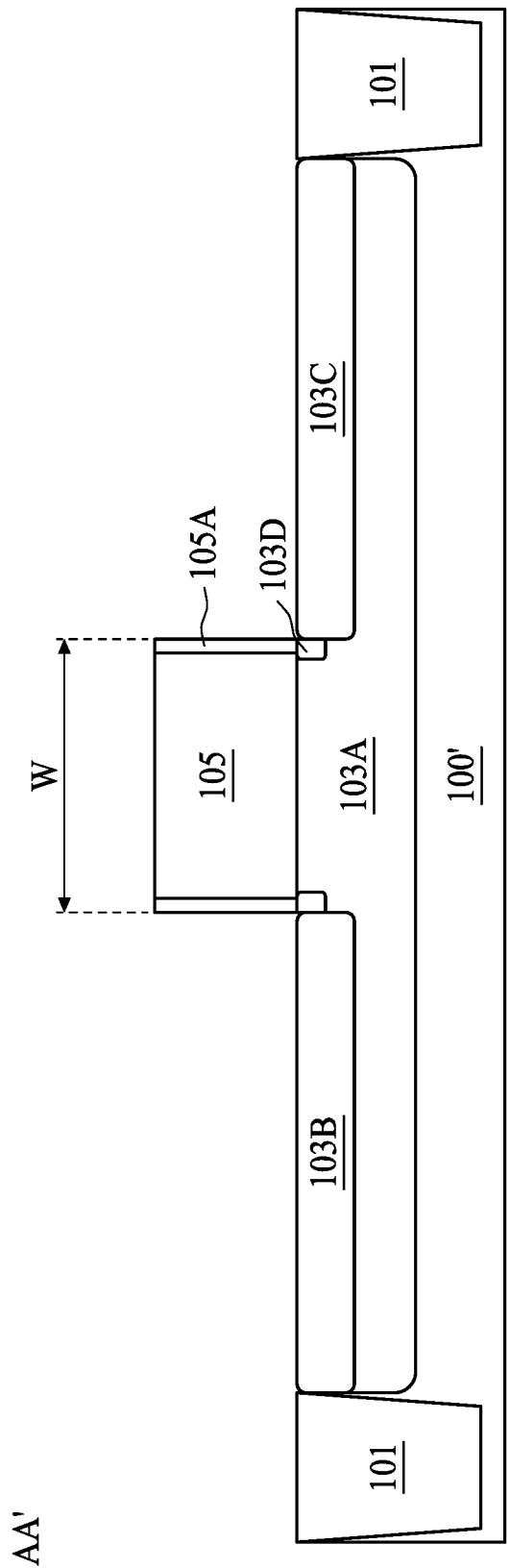
FIG. 2 is a cross sectional view of a semiconductor structure dissecting along line AA' in FIG. 1.

FIG. 2 is a cross sectional view of a semiconductor structure 100 dissecting along line AA' in FIG. 1. Line AA' in FIG. 1 crosses (from left to right) the isolated region 101, the active region 103, the gate stripe 103, the active region 103, and again the isolated region 101. As shown in FIG. 2, the active region 103 includes, for example, a p-well 103A, an n-doped source 103B, an n-doped drain 103C, and lightly doped drain region 103D in a semiconductor substrate 100'. In some embodiments, the substrate 100' includes a silicon substrate (e.g., wafer) in crystalline structure. The substrate 100' may include various doping configurations depending on design requirements as is known in the art (e.g., p-type substrate or n-type substrate). Other examples of the substrate 100' may also include other elementary semiconductors such as germanium and diamond. Alternatively, the substrate 100' may include a compound semiconductor such as, silicon carbide, gallium arsenide, indium arsenide, or indium phosphide. Further, the substrate 100' may optionally include an epitaxial layer (epi layer), may be strained for performance enhancement, and/or may include a silicon-on-insulator (SOI) structure. A cross section of the gate 105 is positioned over the active region 103 and is surrounded by sidewall spacer 105A.

Figure 3:
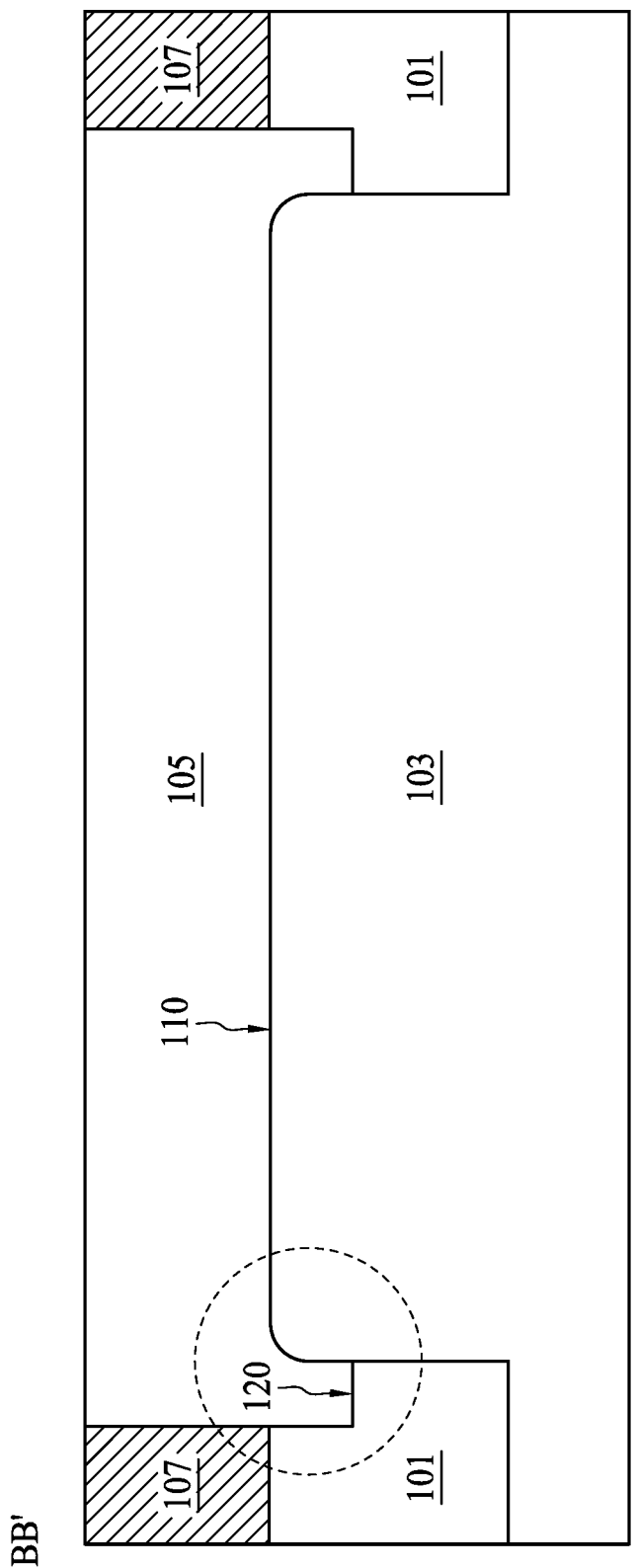
FIG. 3 is a cross sectional view of a semiconductor structure dissecting along line BB' in FIG. 1.

FIG. 3 is a cross sectional view of a semiconductor structure 100 dissecting along line BB' in FIG. 1. Line BB' in FIG. 1 crosses (from top to bottom) the isolated region 101, the gate stripe 105, and again the isolated region 101. In FIG. 3, gate stripe 105 covers a portion of the isolated region 103. Hereinafter, the top surface of the active region 103 is termed a "first surface" 110, the top surface of the isolated region 101 is termed a "second surface" 120. In some embodiments, the first surface 110 is higher than the second surface 120 as a result of a higher selectivity to the dielectric materials during an etchback operation of the dielectric materials in the isolated region 101. The formation of the dishing surface (i.e. the second surface 120) is further described from FIG. 13 to FIG. 15 of the present disclosure. In some embodiments, the gate 105 of the semiconductor structure 100 is a metal gate including multiple metal layers (not shown in FIG. 3). The gate 105 is formed to fill recess formed by the dishing surface (i.e. the second surface 120) and in contact with the first surface 110. Dielectric materials 17 such as interlayer dielectric (ILD) are positioned abutting the gate 105 and defining approximately a gate length along line BB' of FIG. 1.

Figure 4:
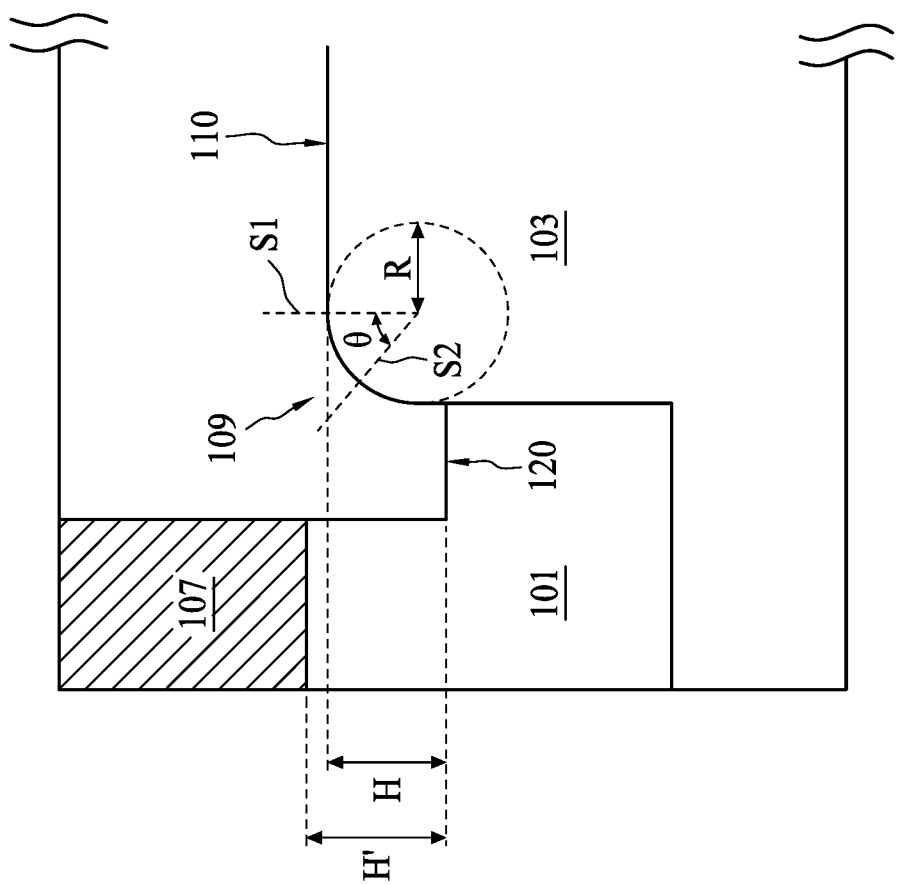
FIG. 4 is an enlarged cross sectional view of a step coverage of a semiconductor structure, in accordance with some embodiments of the present disclosure.

Referring to FIG. 4, FIG. 4 is an enlarged cross sectional view of a step coverage of a semiconductor structure, in accordance with some embodiments of the present disclosure. Numeral labels identical with those described elsewhere in the present disclosure represent same elements or the equivalents thereof and are not repeated here for simplicity. In FIG. 4, a rounded corner 109 connects the first surface 110 and the second surface 120. In some embodiments, the rounded corner 109 can be approximated as a segment of a curve having a radius of curvature R. A dotted circle with the radius of curvature R is illustrated for the purpose of clarity. An angle θ can be defined with respect to the center of the dotted circle. A first side S1 of the angle θ pointing upward is assumed directing to zero degree, and another side S2 of the angle θ pointing toward the corner 109 is assumed directing to θ degree. In some embodiments, θ can be 45.

Still referring to FIG. 4, in some embodiments, a step height H between the first surface 110 and the second surface 120 can be in a range of from about 9 nm to about 11 nm. On the other hand, a height difference H' between the second surface 120 and an interface of the dielectric materials 107 and the isolated region 101 can be different from the step height H. In some embodiments, the height difference H' is greater than the step height H.

Figure 5:
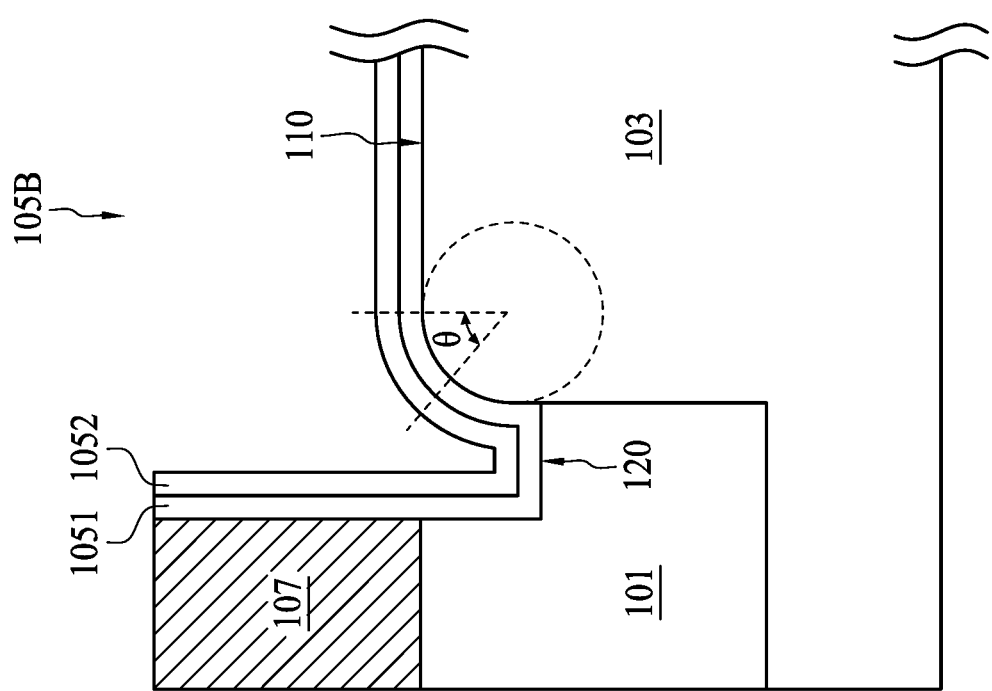
FIG. 5 is an enlarged cross sectional view of a step coverage of a semiconductor structure, in accordance with some embodiments of the present disclosure.

Referring to FIG. 5, FIG. 5 is an enlarged cross sectional view of a step coverage of a semiconductor structure, in accordance with some embodiments of the present disclosure. Two layers are shown in the gate trench 105B. In FIG. 5, an oxide layer 1051 is formed over the first surface 110, the corner 109, and the second surface 120. In some embodiments, the oxide layer 1051 can further include an interfacial oxide layer and a high K dielectric layer. In addition, a metal layer 1052 is disposed over the oxide layer 1051, following the contour of the underlying surfaces. In some embodiments, the metal layer 1052 is a work function metal layer. For example, if the semiconductor structure 100 is an NFET, the metal layer 1052 is an N work function metal layer such as an Al-containing layer. Other metal layer may include one or more layers of material, such as, liners, TiN and/or TaN adhesion layer, TiN blocking layer, a Co wetting layer, and/or other suitable materials. A gate electrode may include titanium (Ti), tantalum nitride (TaN), tungsten nitride (WN), ruthenium (Ru), and aluminum (Al).

Figure 6:
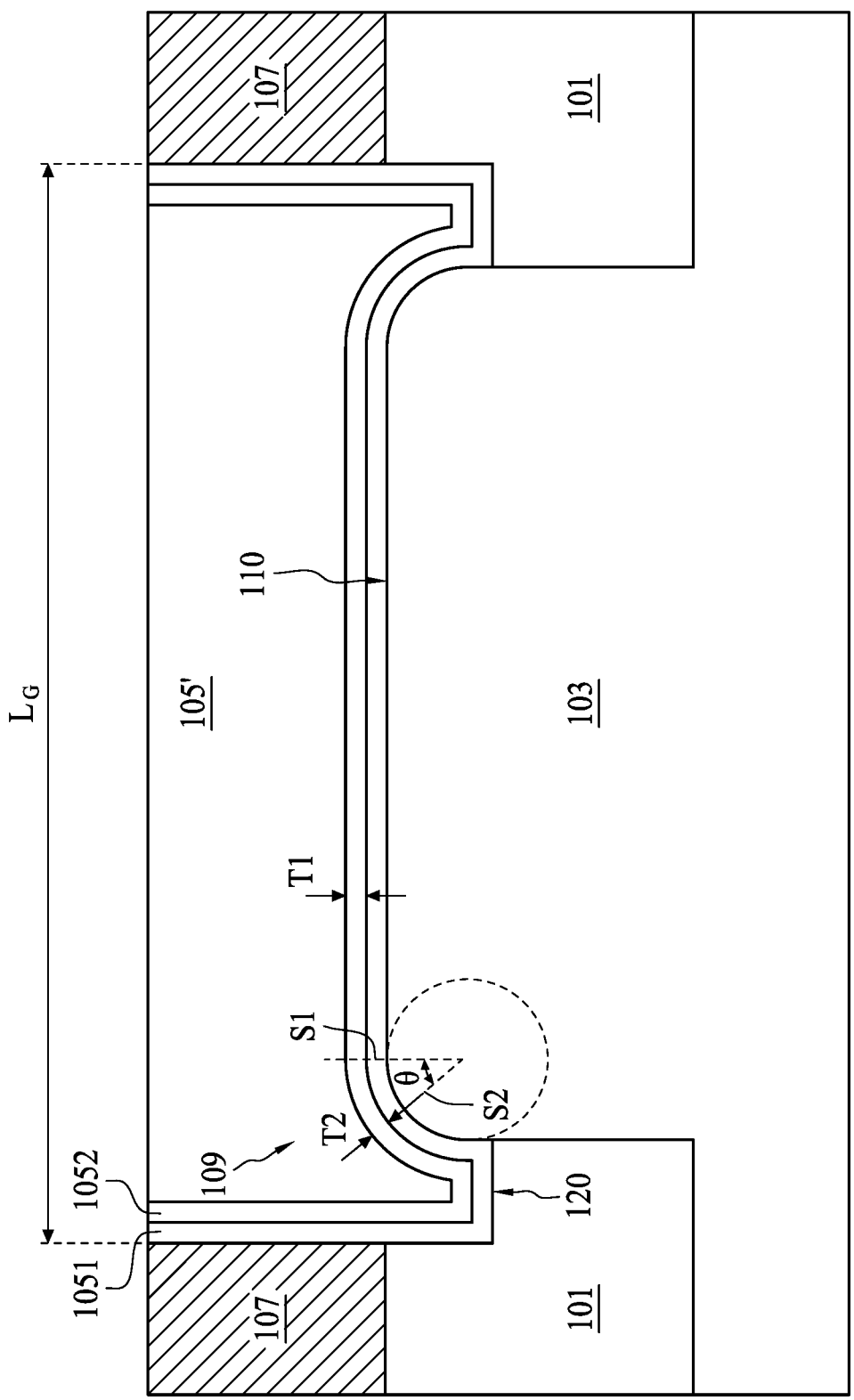
FIG. 6 is a cross sectional view of a quantified step coverage of a semiconductor structure, in accordance with some embodiments of the present disclosure.

Referring to FIG. 6, FIG. 6 is a cross sectional view of how to quantify a step coverage of a semiconductor structure 100, in accordance with some embodiments of the present disclosure. A step coverage is measured using the parameters introduced in FIG. 6. In some embodiments, the metal layer 1052 can be an Al-containing layer, or a work function metal layer. In some embodiments, the metal layer 1052, which is to be used to quantify the step coverage, is a layer configured to best prevent the aluminum in the aluminum electrode 105' from downward diffusion. In some embodiments, a blocking layer (not shown) composed of TiN is deposited between the aluminum electrode 105' and the work function metal layer 1052. However, the blocking layer may possess a columnar grain structure and thus permitting a finite amount of aluminum to diffuse to the underlying layer through grain boundary diffusion. As a result, the work function metal layer 1052, which possesses a microstructure more resistive to diffusion, is to be used to quantify the step coverage in the present disclosure.

As shown in FIG. 6, the thickness of the work function metal layer 1052 is measured separately at two different regions: (1) over the first surface 110 and (2) in proximity to the rounded corner 109. For example, thickness T1 of the work function metal layer 1052 is measured over the first surface 110, and thickness T2 of the work function metal layer 1052 is measured at an angle θ (i.e. along side S2) around the rounded corner 109. In some embodiments, the angle θ is predetermined to be 45. During a sputtering operation, adatoms are guided in a directional fashion (more in a vertical direction and less in a lateral direction) such that thickness T1 is generally accepted to be greater than thickness T2. Normally, the thickest portion of the work function metal layer 1052 is over the first surface 110, and a thinnest portion of the work function metal layer 1052 can be measured at the corner 109 connecting the first surface 110 and the second surface 120. In some embodiments, a ratio T2/T1 is greater than about 40%. Compared to a conventional metal gate structure, where the ratio T2/T1 is generally below 30%, the semiconductor structure 100 disclosed herein has at least a 30% increase regarding the step coverage.

Still referring to FIG. 6, in some embodiments, a thickness T1 of the Al-containing layer or the work function metal layer is in a range of from about 15 nm to about 20 nm. As shown in FIG. 6, a gate length $L_G$ can be defined approximately equal to a length of the first surface 110. A gate width $W_G$ can be defined in a cross section orthogonal to FIG. 6, as shown in FIG. 2, in some embodiments, a gate width $W_G$ can be about or below 20 nm.

Following is a method for manufacturing a semiconductor structure 100 as discussed previously in the present disclosure. The method includes changing the energy distribution of the plasma ions from a directional state (i.e., substantially higher ion flux in a vertical direction than in a horizontal direction) to a less directional state (i.e. higher ion flux in a horizontal direction than in a vertical direction). In some embodiments, the method includes tuning impedance associated with the semiconductor substrate when forming a work function metal layer of a metal gate. In some embodiments, the impedance associated with the semiconductor substrate is tuned to be greater than an impedance of a grounded wall of a sputtering chamber.

Figure 7B:
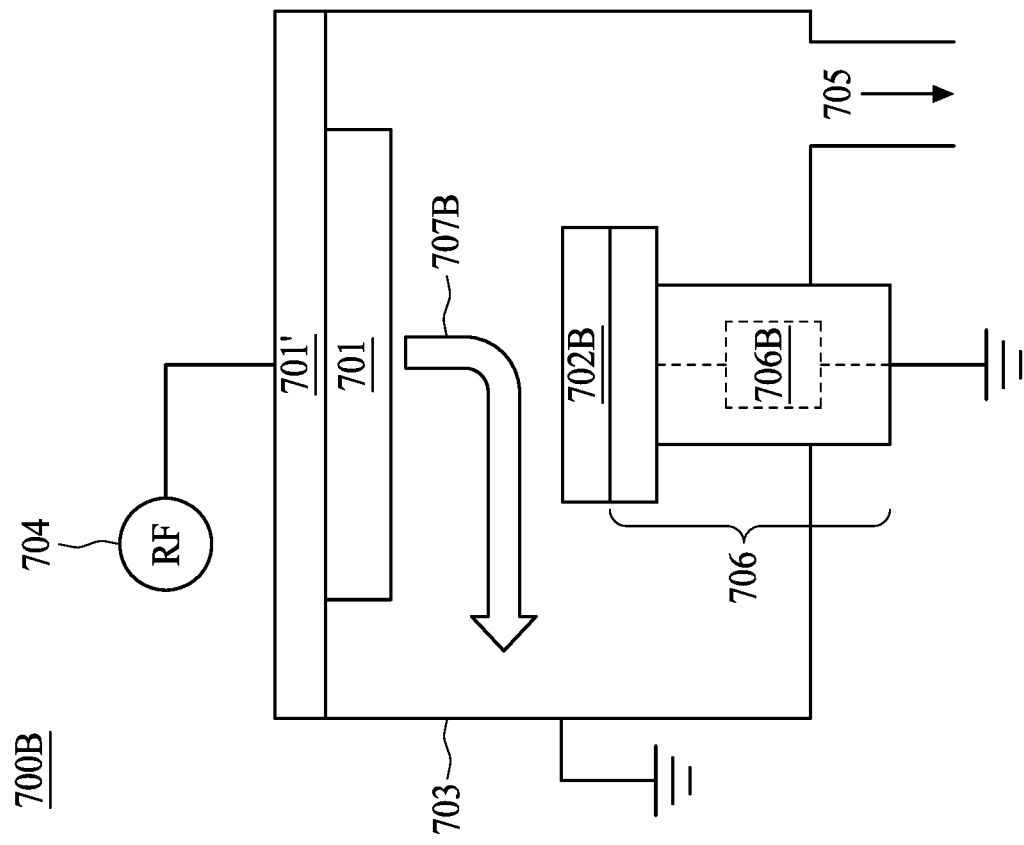
FIG. 7B is a cross sectional view of a sputtering apparatus where an impedance of the semiconductor substrate is greater than an impedance of a grounded wall.
Figure 7A:
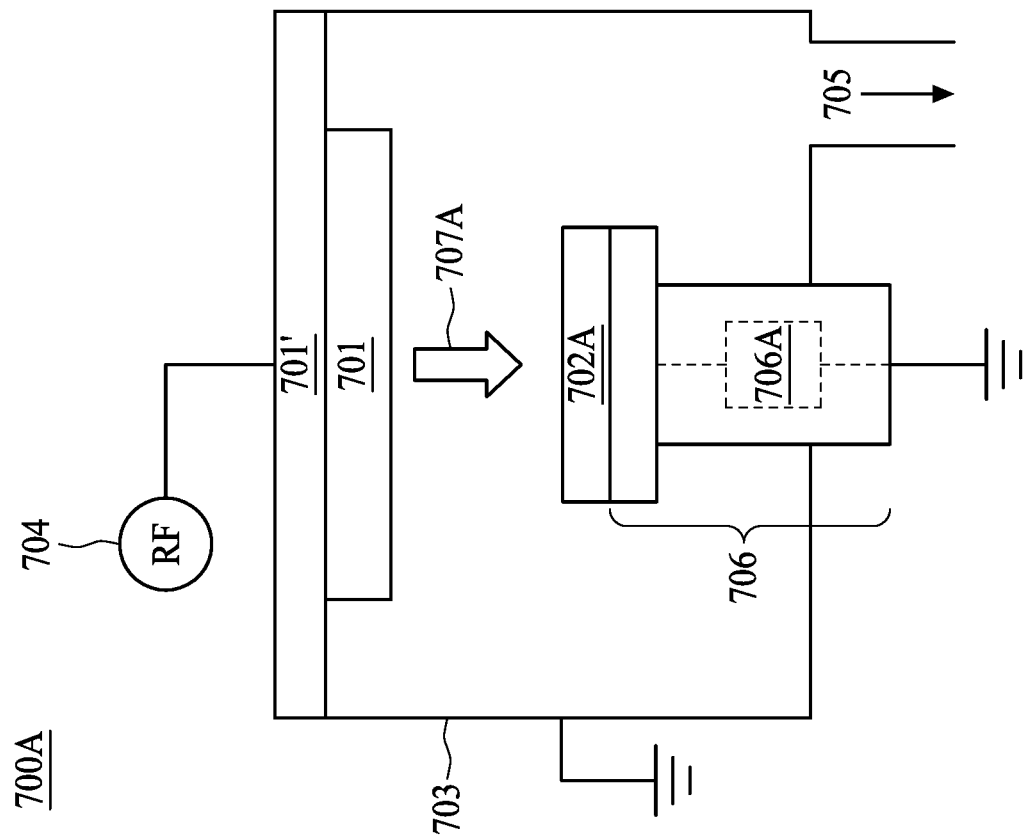
FIG. 7A is a cross sectional view of a sputtering apparatus where an impedance of a grounded wall is greater than an impedance of the semiconductor substrate.

Referring to FIGS. 7A and 7B, FIG. 7A is a cross sectional view of a sputtering apparatus 700A where an impedance of a grounded wall 703 is greater than an impedance 706A of the semiconductor substrate 702A. In a conventional sputtering scheme, sputtering apparatus 700A and the impedance control status thereof is widely-adopted. FIG. 7B is a cross sectional view of a sputtering apparatus 700B where an impedance 706B of the semiconductor substrate 702B is greater than an impedance of a grounded wall 703. In the present disclosure, at least in the sputtering operation for the formation of the work function metal layer, the sputtering apparatus 700B and the impedance control status thereof is adopted.

As shown in FIG. 7A, the sputtering apparatus 700A includes a vacuum chamber enclosed by a cylindrical sidewall 703 and a ceiling 701'. A workpiece support pedestal 706 within the chamber has a support surface for supporting a workpiece such as a semiconductor wafer 702A. The support pedestal 706 may consist of an insulating (e.g., ceramic) top layer and a conductive base supporting the insulating top layer. Process gas is introduced into the chamber by suitable gas dispersing apparatus. For example, the gas dispersing apparatus consists of gas injectors in the sidewall 703. Gas pressure in the chamber is controlled by a vacuum pump (not shown) coupled to the chamber through a pumping port 705 close to a floor. A PVD sputter target 701 is supported on the interior surface of the ceiling 701'. The sputter target 701 is typically a material, such as a metal, to be deposited on the surface of the wafer 702A. An RF plasma source power may be applied to the target 701 from an RF plasma source power generator 704 of frequency fs through an impedance match (not shown). The target 701 functions as an electrode that capacitively couples RF source power to plasma in the chamber. The same sputtering apparatus setting applies to the sputtering apparatus 700B.

In FIG. 7A, sidewall 703 is grounded, and hence the sidewall 703 takes a ground potential. Conventionally, an impedance 706A associated with the semiconductor substrate 702A is lower than an impedance of the sidewall 703, such that most of the RF current 707A can be directed to the semiconductor substrate 702A, resulting to a directional sputtered film on the semiconductor substrate 702A. However, the directional deposition set forth generates a poor quality film at "weak spots" (this term is previously discussed in the present disclosure), especially when the semiconductor substrate to be deposited has a step morphology. This is due to the fact that substantially more plasma ions are directed to become atatoms on a top surface of the step, and less plasma ions are directed to become adatoms on a vertical sidewall of the step. A corner region connecting the top surface and the sidewall thus forms a "weak spot" where the film thickness measured can be more than 70% thinner than that at the top surface of the step.

To solve the aforesaid problem, the directional deposition as shown in FIG. 7A can be replaced by a less directional deposition, and the setting of which is illustrated in FIG. 7B. The impedance 706B associated with the semiconductor substrate 702B is changed to be greater than an impedance of the sidewall 703, such that most of the RF current 707B can be directed to the sidewall 703, resulting to a less directional sputtered film on the semiconductor substrate 702B. Various tuning techniques for increasing the impedance associated with the semiconductor substrate will be discussed later in the present disclosure.

Figure 8B:
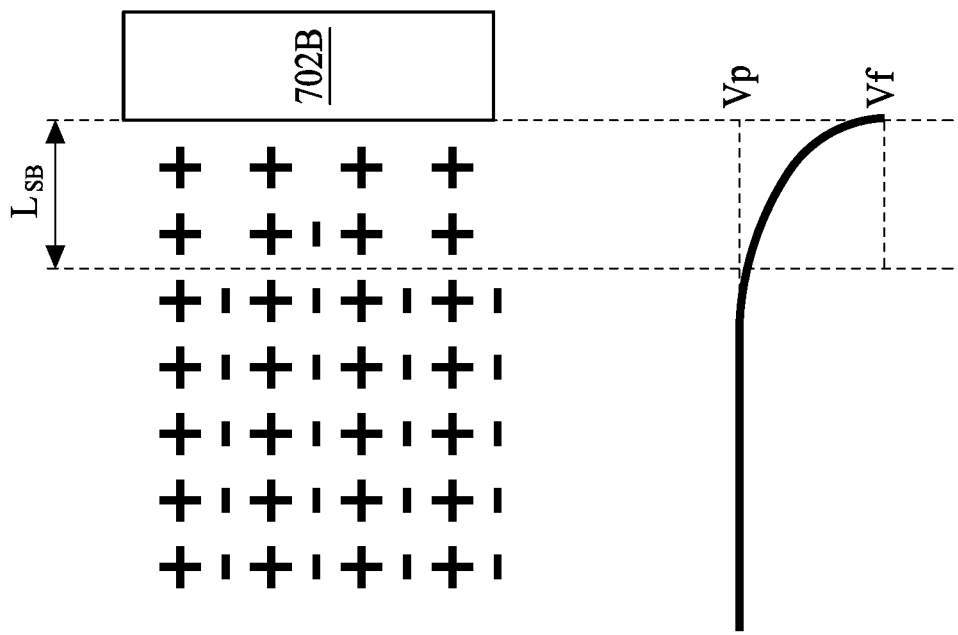
FIG. 8B is a schematic illustration showing a sheath potential in a sputtering apparatus in accordance with FIG. 7B.
Figure 8A:
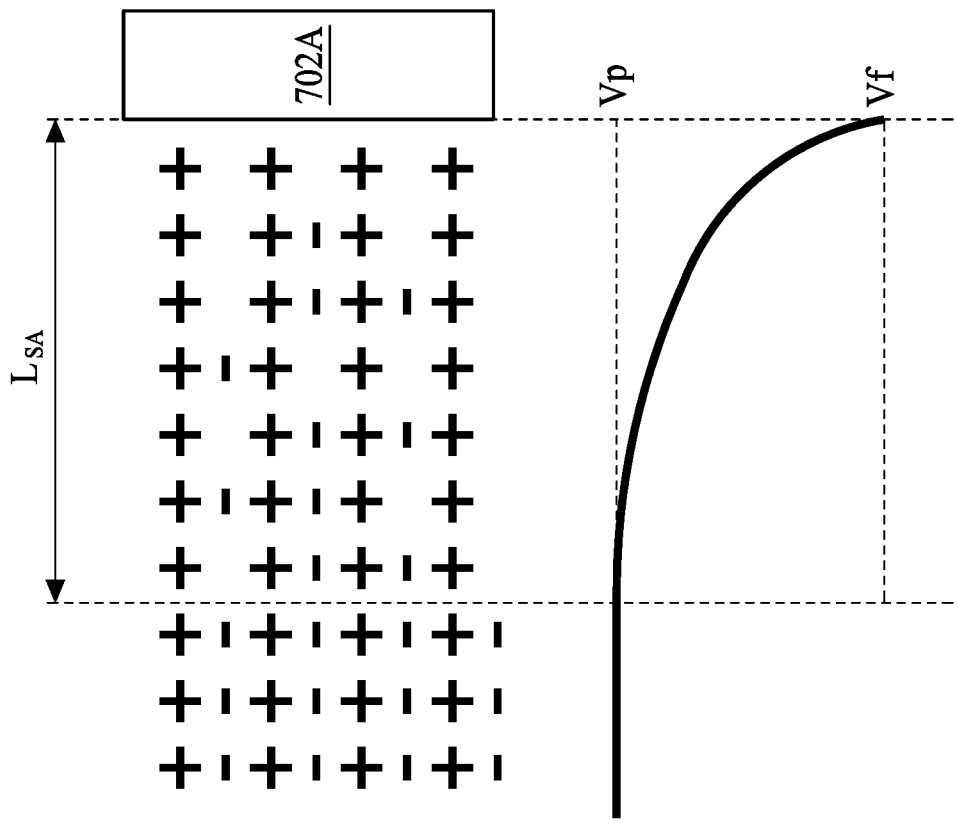
FIG. 8A is a schematic illustration showing a sheath potential in a sputtering apparatus in accordance with FIG. 7A.

Referring to FIG. 8A and FIG. 8B, FIG. 8A is a schematic illustration showing a sheath potential $V_{PA}$ in a sputtering apparatus 700A in accordance with FIG. 7A, and FIG. 8B is a schematic illustration showing a sheath potential $V_{PB}$ in a sputtering apparatus 700B in accordance with FIG. 7B. When the impedance associated with the semiconductor substrate is substantially lower than that associated with the sidewall, as shown in FIG. 8A, a longer length $L_{SA}$ of the sheath region (dark region) can be obtained and a sheath potential $V_{PA}$ is high enough to enhance the deposition rate or to enhance the deposition quality of the deposited film. After tuning the impedance associated with the semiconductor substrate to be greater than that associated with the sidewall, as shown in FIG. 8B, a shorter length $L_{SB}$ of the sheath region (dark region) can be obtained and a sheath potential $V_{PB}$ is decreased to be close to a floating voltage.

Figure 9A:
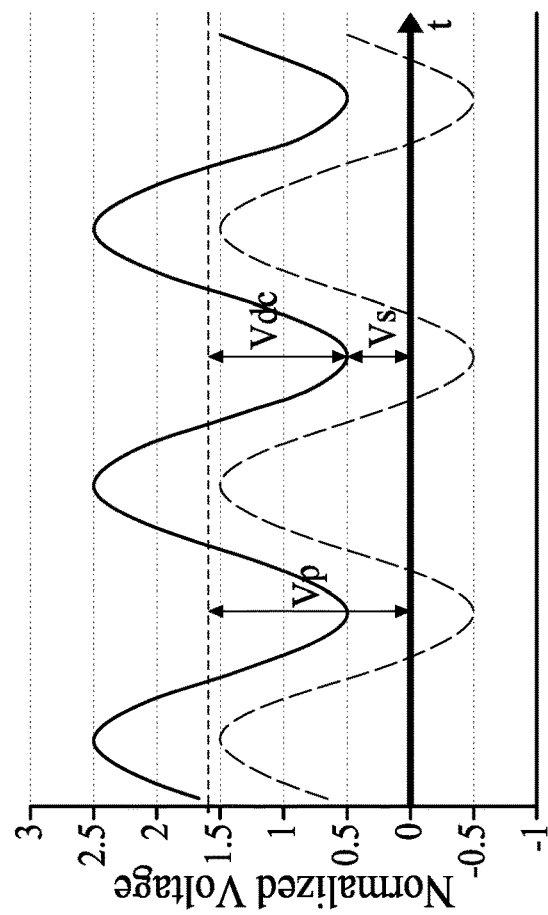
FIG. 9A is a schematic illustration showing a plasma potential and an RF potential in a sputtering apparatus in accordance with FIG. 7A.
Figure 9B:
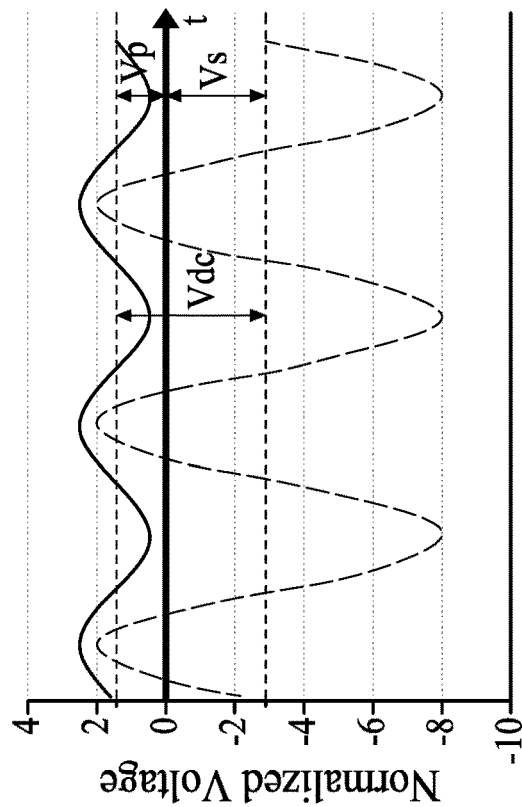
FIG. 9B is a schematic illustration showing a plasma potential and an RF potential in a sputtering apparatus in accordance with FIG. 7B.

Similarly, referring to FIG. 9A and FIG. 9B, FIG. 9A is a schematic illustration showing a plasma potential (solid line) and an RF potential (dashed lines) measured at a hot electrode (i.e. the target 701) in a sputtering apparatus 700A in accordance with FIG. 7A, and FIG. 9B is a schematic illustration showing a plasma potential (solid line) and an RF potential (dashed lines) at a hot electrode (i.e. the target 701) in a sputtering apparatus 700B in accordance with FIG. 7B. When the impedance associated with the semiconductor substrate is substantially lower than that associated with the sidewall, as shown in FIG. 9A, a negative self bias Vs is obtained, and a directional deposition follows under the conventional sputtering scheme. On the other hand, when the impedance associated with the semiconductor substrate is greater than that associated with the sidewall, as shown in FIG. 9B, a positive self bias Vs is obtained, consequently, a less directional deposition occurs to form a deposited film with better step coverage. In some embodiments, the DC bias Vdc can be in a range of from about 35V to about 60V.

Referring to FIG. 10, FIG. 10 is a cross sectional view of a sputtering apparatus where a target 701 and the semiconductor substrate 702 have substantial identical surface areas. Conventionally, in order to create negative plasma potential in proximity to the semiconductor substrate 702, an asymmetric electrode system, usually the surface area ratio ($A_T/A_S$) between the target 701 and the substrate 702 being greater than unity, is adopted. In some embodiments, altering the surface area ratio ($A_T/A_S$) to be close to unity or even less than unity may change the impedance associated with the semiconductor substrate 702. However, other methods such as adjusting RF power, altering chamber pressure, or changing the process gas species may also serve the purpose of tuning the impedance associated with the semiconductor substrate to be greater than that associated with the sidewall, and thus are within the contemplated scope of the present disclosure.

Figure 11B:
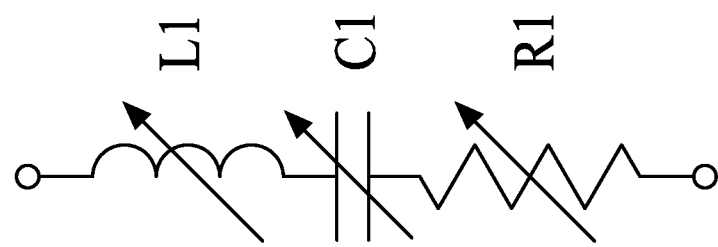
FIG. 11B shows elements affecting the impedance of FIG. 11A.
Figure 11A:
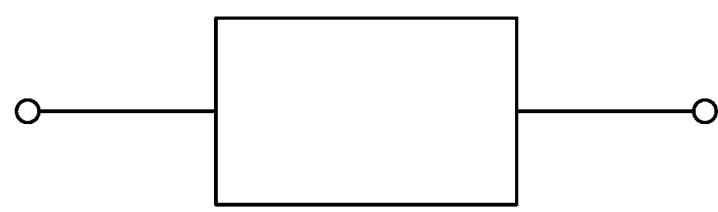
FIG. 11A is an equivalent circuit of an impedance.

FIG. 11A shows an equivalent circuit of an impedance associated with the semiconductor substrate, and FIG. 11B exemplifies electrical elements which can be tuned to adjust the overall impedance associated with the semiconductor substrate. For example, the pedestal supporting the semiconductor substrate is coupled to a variable inductor L1, a variable capacitor C1, or a varistor R1. In some embodiments, a stepper motor and a current sensor may be implemented to adjust the impedance by controlling and monitoring the aforesaid electrical elements. FIG. 11B is not limiting to the type of connection of the aforesaid electrical elements. For example, L1, C1, and R1 may not be connected in series. Any other types of connection of the electrical elements selected from L1, C1, and R1 are within the contemplated scope of the present disclosure. By tuning the inductance of L1, the capacitance of C1, and/or the resistance of R1, the impedance associated with the semiconductor substrate can be tuned to be greater to that associated with the sidewall. In some embodiments, the impedance associated with the semiconductor substrate can be tuned to form an open circuit.

Figure 12:
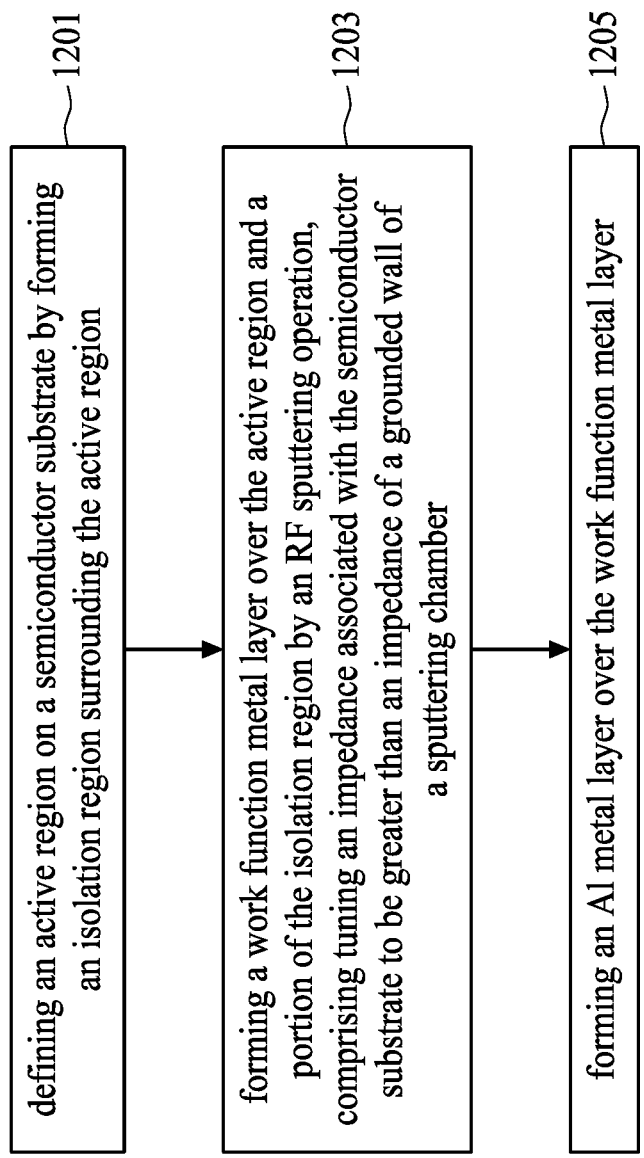
FIG. 12 is an operational flow for manufacturing a semiconductor structure, in accordance with some embodiments of the present disclosure.
Figure 13:
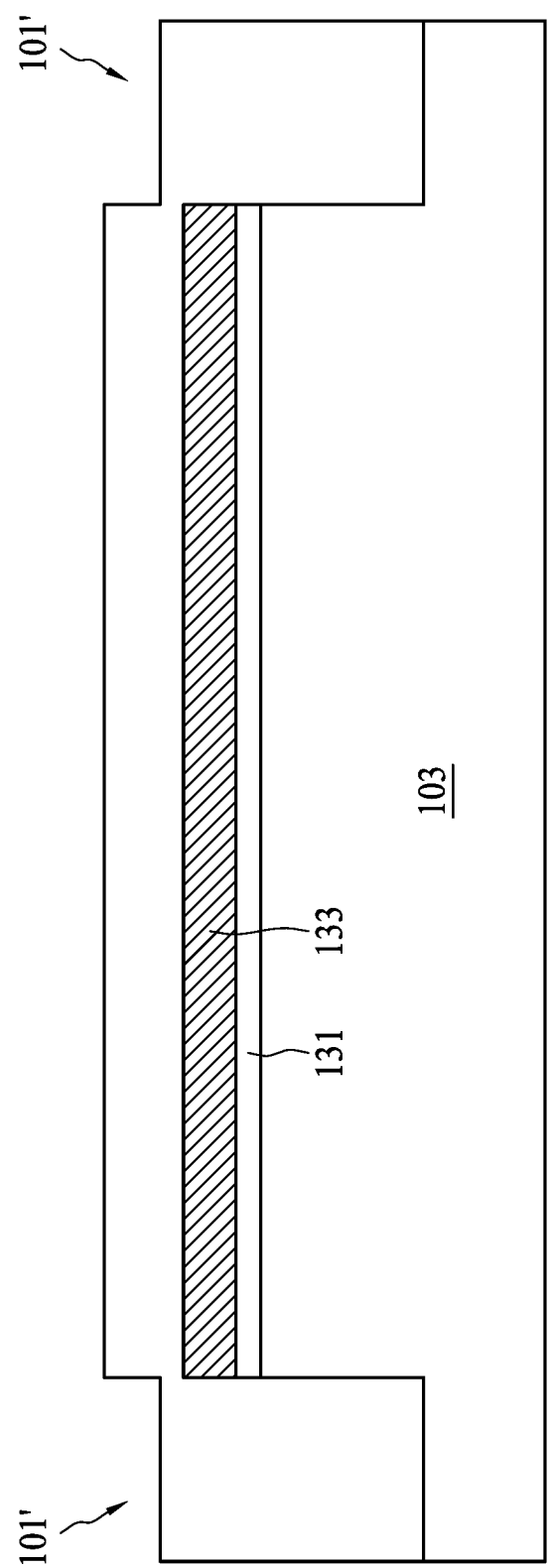
FIG. 13 to FIG. 20 show cross sectional views of fragmental operations for manufacturing a semiconductor structure, in accordance with some embodiments of the present disclosure.
Figure 14:
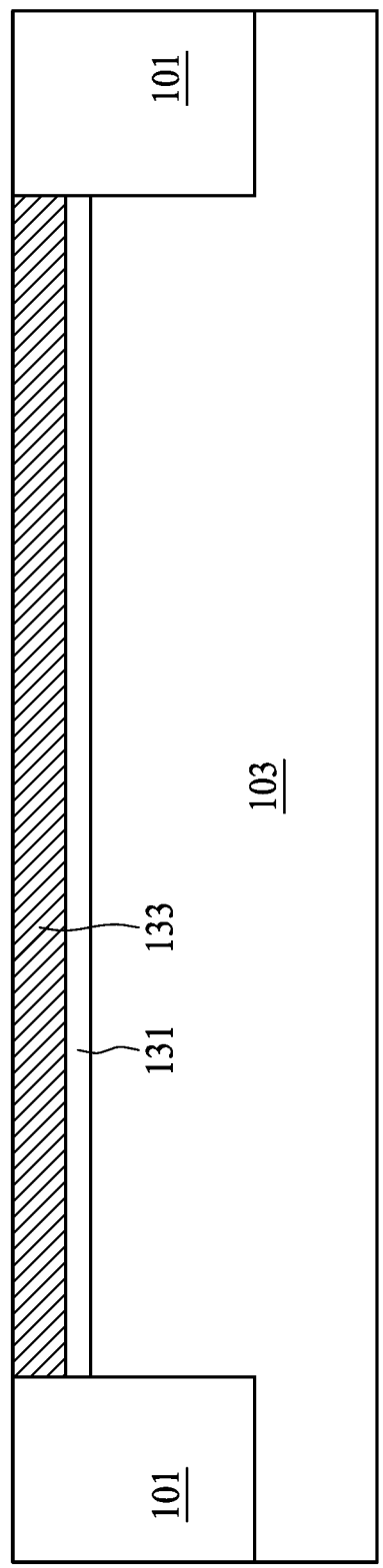
Figure 15:
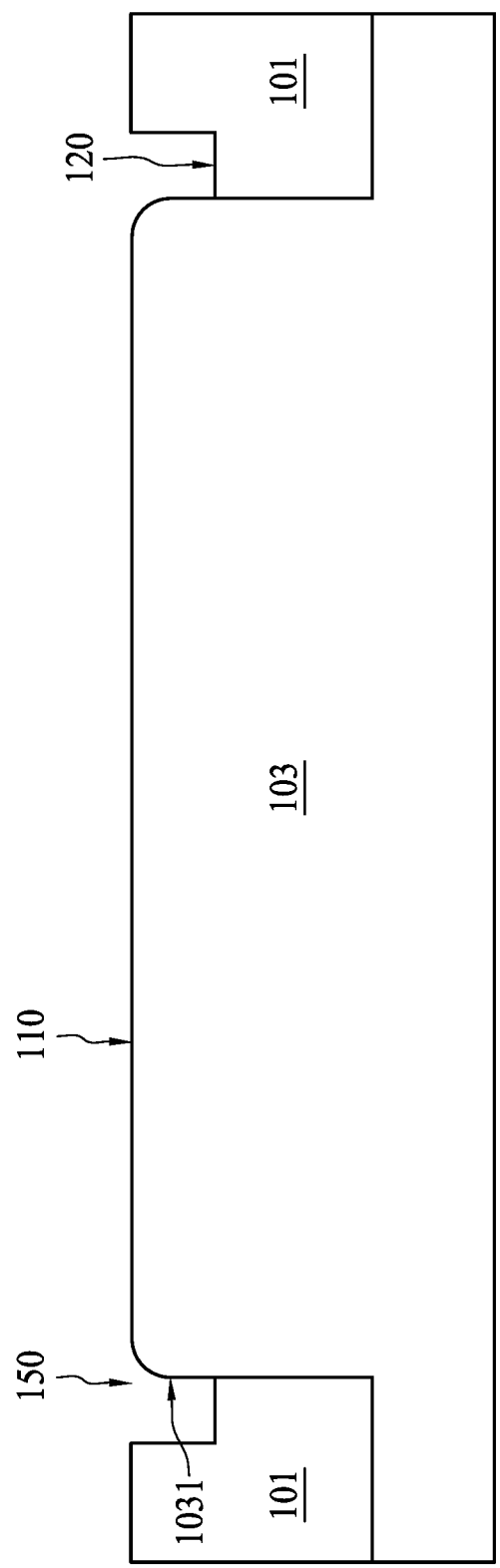

FIG. 12 is an operational flow for manufacturing a semiconductor structure, and FIG. 13 to FIG. 20 show cross sectional views of fragmental operations for manufacturing a semiconductor structure in accordance to the operational flow of FIG. 12. Referring to FIG. 13 to FIG. 15 and operation 1201, an active region 103 is defined on a semiconductor substrate by forming an isolated region 101 surrounding the active region 103. In FIG. 13, a pad oxide layer 131 and a nitride layer 133 may be formed over a top surface of the semiconductor substrate and serve as a hard mask for patterning trenches 101'. Dielectric materials are subsequently deposited to fill the trenches 101' and further deposited on the top surface of the semiconductor substrate. In FIG. 0.14, a planarization operation is carried out to remove the overfill portion of the dielectric material, and the planarization operation may stop at an etch stop (i.e. the nitride layer 133).

Subsequently, as shown in FIG. 15, a wet etch operation is conducted to remove at least the etch stop (i.e. the nitride layer 133) in order to further etch down the top surface of the dielectric materials to level with a first surface 110 of the active region 103. During the wet etch operation, the etchant used to remove the nitride layer 133 is prone to attack the dielectric materials abutting the nitride layer 133 through a heterointerface, and thus creating a recess 150 exposing a portion of the sidewall 1031 of the active region 103. A second surface 120 substantially lower than the first surface 110 is formed after the planarization operation. In some embodiments, the pad oxide layer 131 is also removed after the planarization operation.

Figure 16:
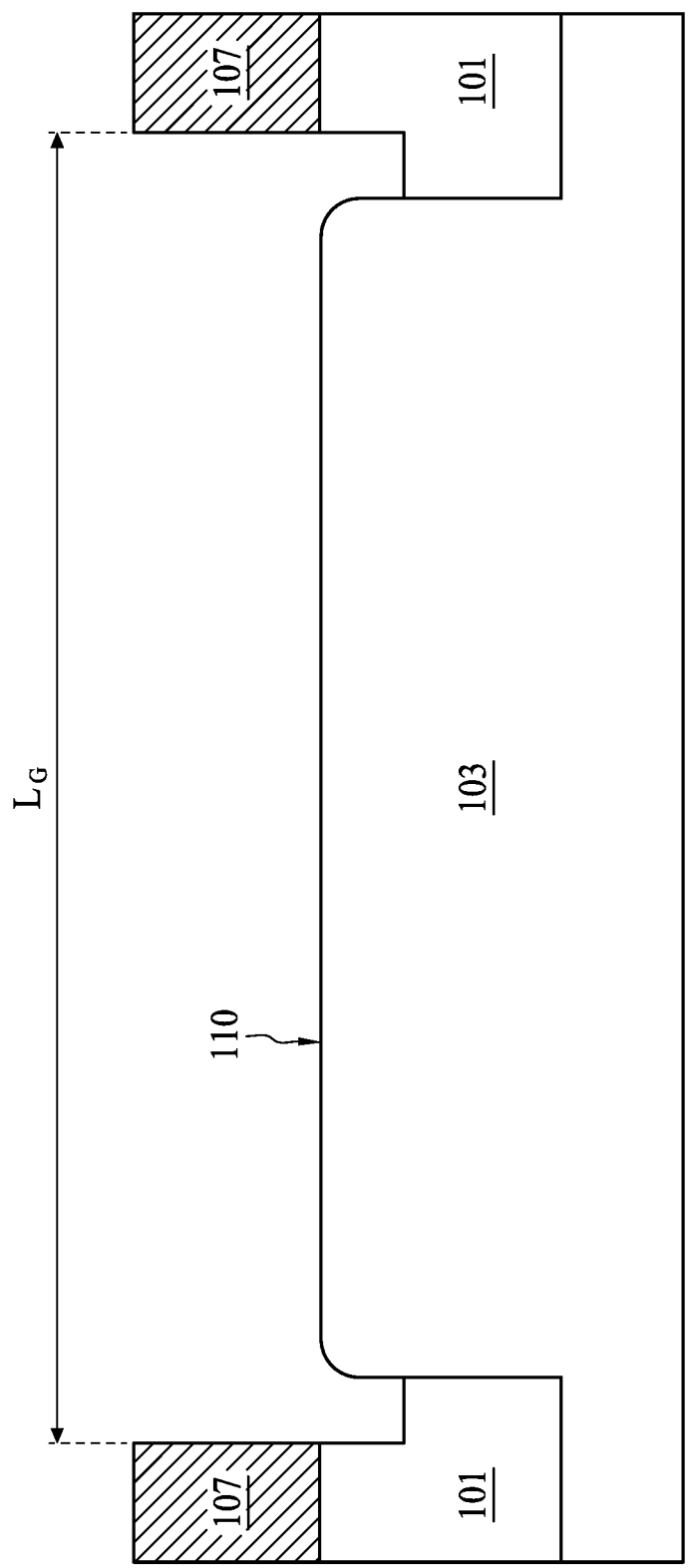
Figure 17:
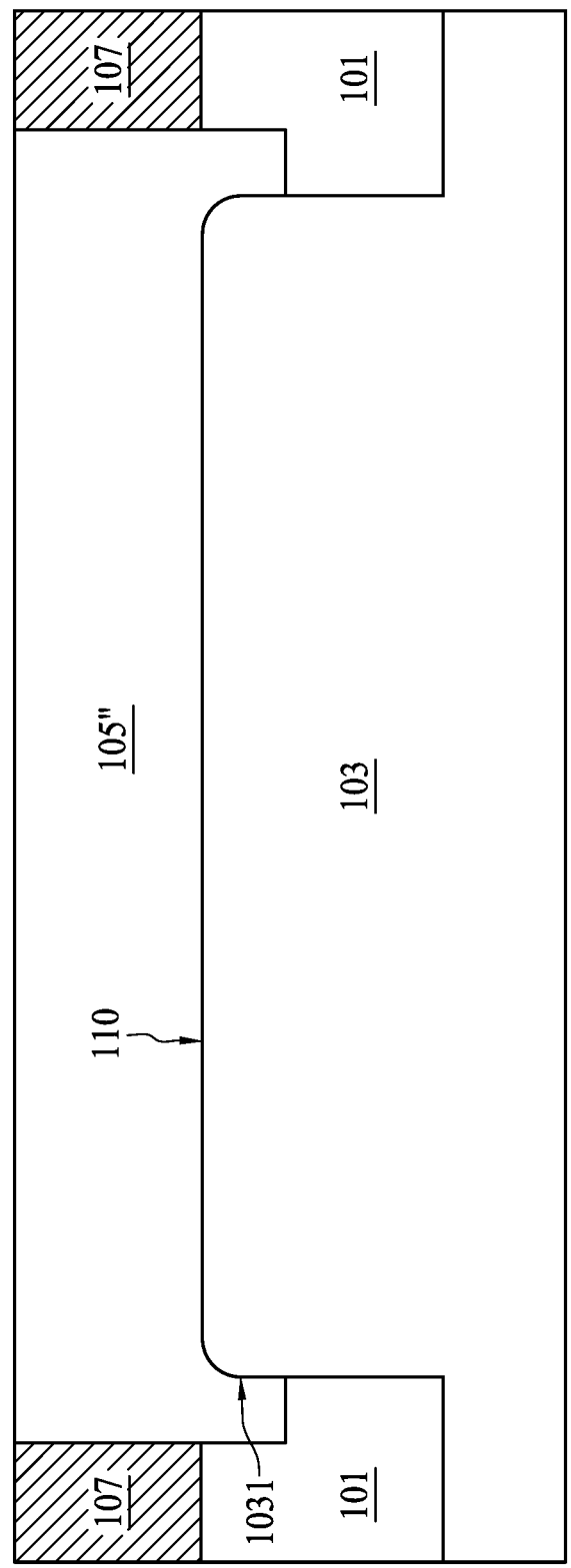

FIG. 16 and FIG. 17 show operations of forming a dummy gate 105" for subsequent implantation operations. In some embodiments, a "gate last" or a "gate replacement" operation is adopted. In a gate last operation, dummy gate 105" is formed and continues with processing to form various features of the transistors until deposition of an inter-layer dielectric (ILD). The dummy gate 105" is then removed thereby forming a gate trench for subsequent metal gate formation. For example, although the methods implements a "gate last" approach, the methods disclosed herein may be used in a hybrid operation in which one type of metal gate is formed in a conventional "gate first" operation and the other type of metal gate is formed in a "gate last" operation. In FIG. 16, a masking layer 107 is formed to define a gate length $L_G$ across the surface of the active region 103, and dummy gate 105" is formed, for example, by depositing polysilicon over the first surface 110. In some embodiments, the polysilicon fills the recess 150 abutting the sidewall 1031 of the active region 103.

Figure 18:
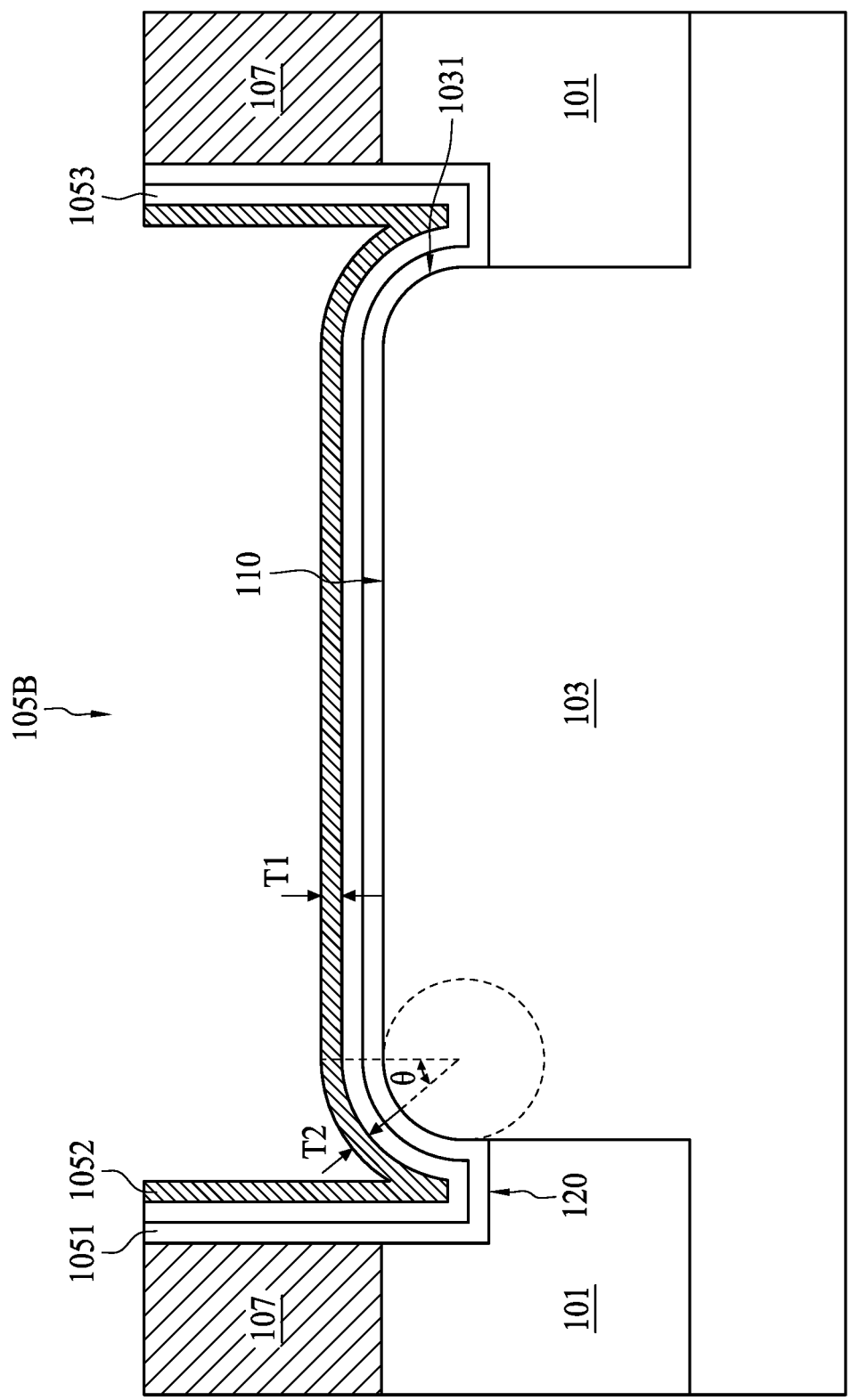
Figure 19:
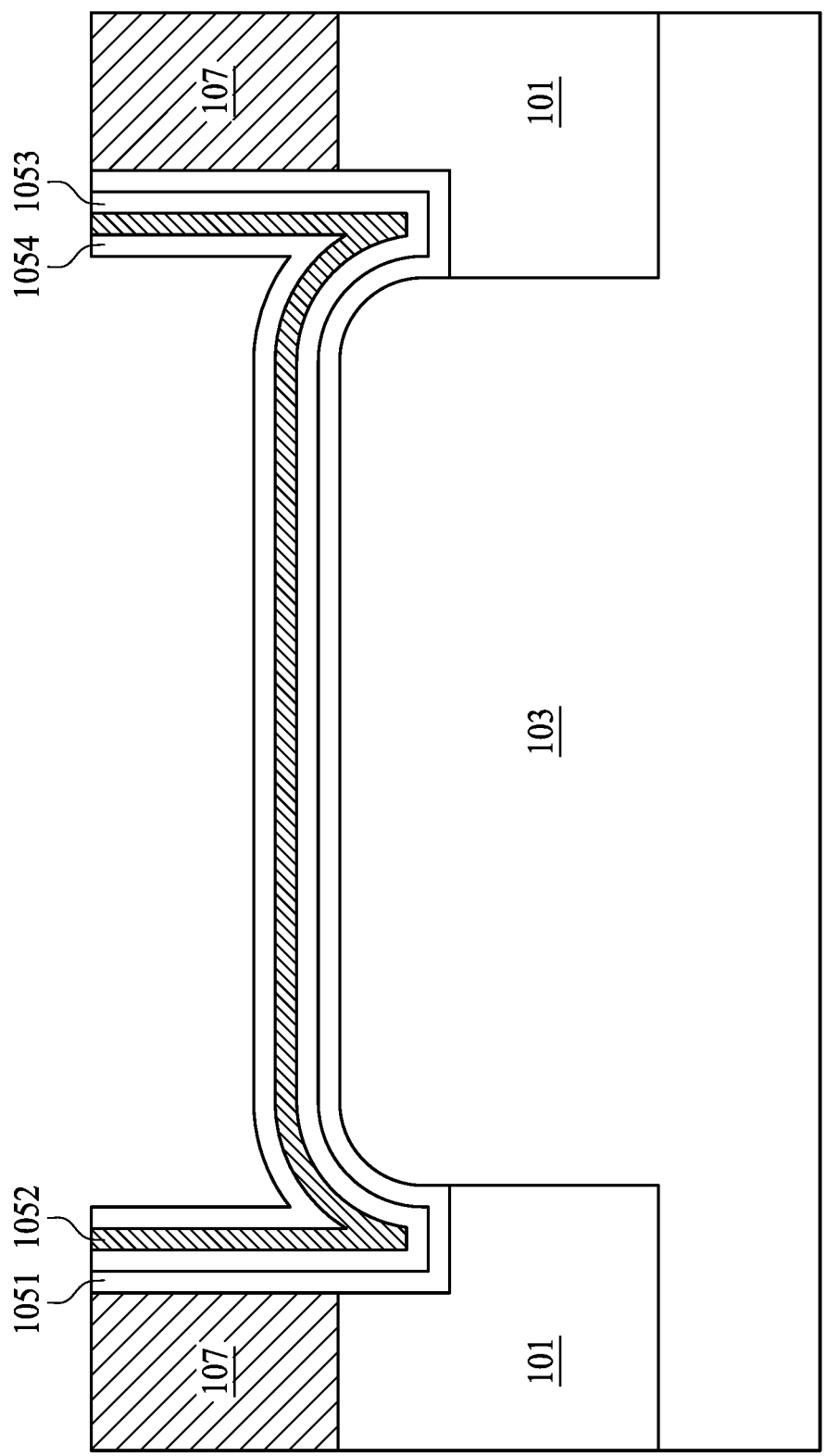

Referring to FIG. 18, FIG. 19, and operation 1203, after various conductive regions being formed in the active region 103, the dummy gate 105" is removed and replaced by a metal gate. FIG. 18 illustrates depositing multiple metal layers in a gate trench 105B after the removal of the dummy gate 105". An oxide layer 1051, a TiN/TaN adhesion layer 1053, and a work function metal layer 1052 are subsequently formed in the gate trench 105B, conforming to the contour of the first surface 110, the second surface 120, and a sidewall 1031 of the active region 103. The work function metal layer 1052 is denoted with shaded lines because at least this layer is to be formed under an impedance tuning operation as previously discussed. In some embodiments, when forming the work function metal layer, an impedance associated with the semiconductor substrate is tuned to be greater than an impedance associated with the sidewall of the sputtering chamber. The impedance may be tuned to form an open circuit. In other embodiments, when forming each layer of the metal gate, the aforesaid impedance tuning operation may be adopted. A blocking layer 1054 composed of TiN can be formed over the work function metal layer 1052, as shown in FIG. 19. In some embodiments, the blocking layer is configured to prevent the aluminum downward diffusion but a columnar grain structure inherently limit the intended purpose. Referring back to FIG. 18, a ratio between a thinnest portion (for example, T2) and a thickest portion (for example, T1) work function metal layer 1052 is controlled to be greater than about 40%.

Figure 20:
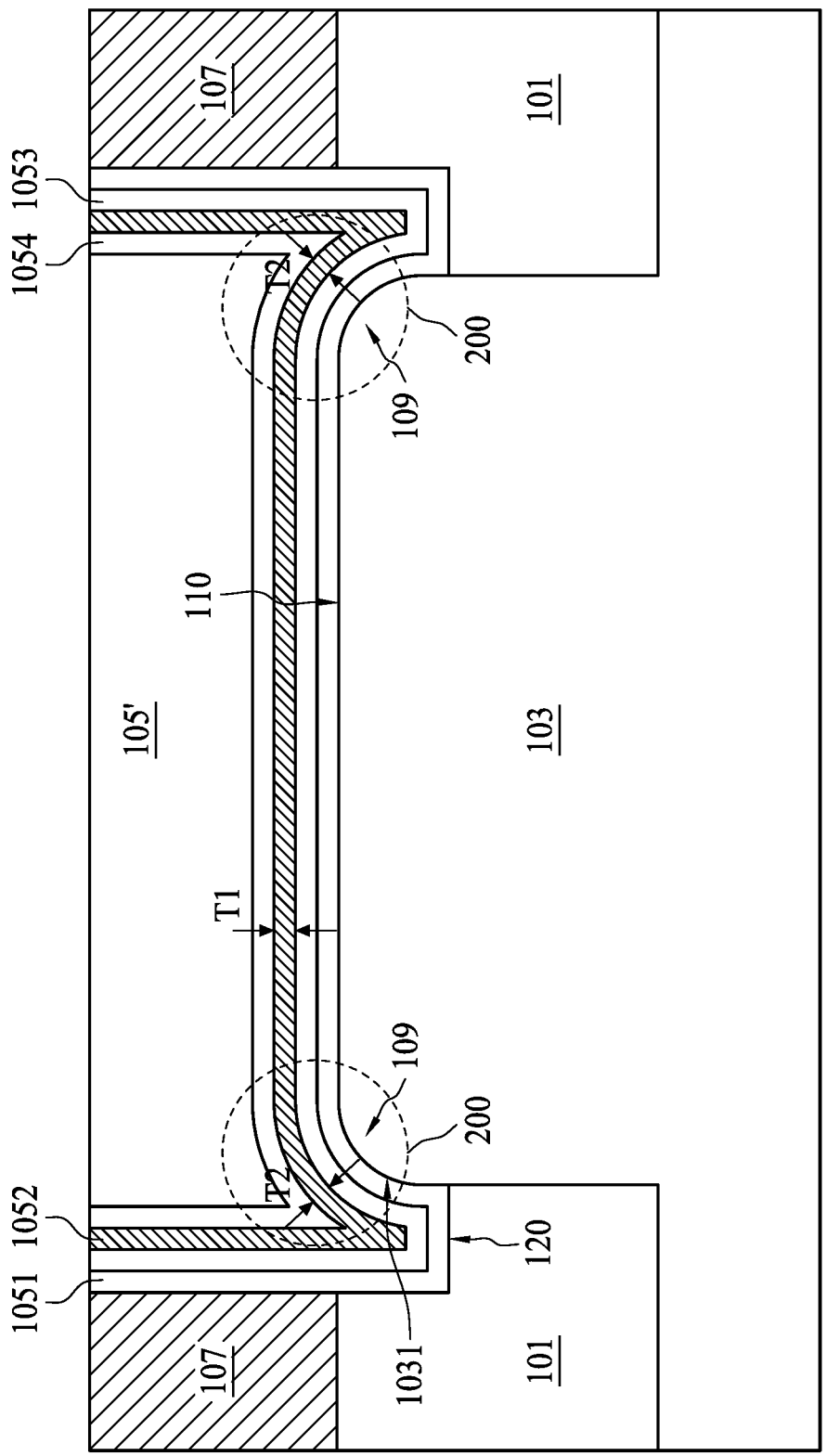

Referring to FIG. 20 and operation 1205, a gate electrode 105' such as aluminum (Al) is form in the gate trench 105B. A layer of cobalt (Co) may be deposited to function as a wetting layer for a subsequent Al fill. The Co layer may be formed by PVD or other suitable operations. A layer of Al may be formed on the wetting layer. A CMP may to remove the gate electrode materials disposed outside of the trench 1052. The CMP may have a high selectivity to provide a substantially planar surface for the gate structures. Accordingly, the metal gate of an nFET may perform the proper n-type work function and the metal gate of the pFET may perform the proper p-type work function. Thus, the desired threshold voltages of the nFET and pFET, respectively, may be achieved without added complexity. It is understood that the semiconductor structure may undergo further processing to form various features such as contacts/vias, interconnect metal layers, inter-metal dielectric, passivation layers, etc.

The semiconductor structure in the present disclosure, as shown in FIG. 20, possesses step coverage (i.e. T2/T1) greater than about 40%, as previously discussed. Accordingly, sufficient thickness T2 of the work function metal layer at the corner 109 of the active region 103 effectively prevents the aluminum from downward diffusion and thus aluminum spiking phenomenon is not observed in "weak spot" 200 of the active region 103.

Some embodiments of the present disclosure provide a semiconductor structure, including an active region with a first surface; an isolated region having a second surface, surrounding the active region, the first surface being higher than the second surface; and a metal gate having a plurality of metal layers disposed over the first surface and the second surface. A ratio of a thinnest portion and a thickest portion of at least one of the plurality of metal layers is greater than about 40%.

In some embodiments of the present disclosure, the at least one of the plurality of metal layers is a work function metal layer.

In some embodiments of the present disclosure, the thickest portion is over the first surface.

In some embodiments of the present disclosure, the thinnest portion is at a corner connecting the first surface and the second surface.

In some embodiments of the present disclosure, the metal gate includes Al metal layer.

In some embodiments of the present disclosure, the semiconductor structure further including a high k dielectric layer between the metal gate and the active region.

In some embodiments of the present disclosure, a height difference between the first surface and the second surface being in a range of from about 9 nm to about 11 nm.

Some embodiments of the present disclosure provide a field effect transistor (FET). The FET includes an active region surrounded by an isolated region, a sidewall and a first surface of the active region protruding from a second surface of the isolated region; and a metal gate at least covering the sidewall and the first surface of the active region. An Al-containing layer of the metal gate includes (1) a first thickness in proximity to the first surface of the active region; and (2) a second thickness in proximity to a corner connecting the first surface and the sidewall of the active region, and a thickness ratio of the of the second thickness and the first thickness is greater than about 40%.

In some embodiments of the present disclosure, the FET is an N-type FET.

In some embodiments of the present disclosure, the Al-containing layer comprises TiAl.

In some embodiments of the present disclosure, the FET further includes a TiN layer between the Al-containing layer and the active region.

In some embodiments of the present disclosure, the second thickness is in a range of from about 1.5 nm to about 2 nm.

In some embodiments of the present disclosure, a length of the metal gate is substantially a length of the first surface, and a width of the metal gate is about 20 nm.

Some embodiments of the present disclosure provide a method for manufacturing a semiconductor structure. The method includes (1) defining an active region on a semiconductor substrate by forming an isolated region surrounding the active region; (2) forming a work function metal layer over the active region and a portion of the isolated region by an RF sputtering operation; and (3) forming an Al metal layer over the work function metal layer. The forming the work function metal layer includes tuning an impedance associated with the semiconductor substrate to be greater than an impedance of a grounded wall of a sputtering chamber.

In some embodiments of the present disclosure, the tuning the impedance associated with the semiconductor substrate includes tuning a capacitive element, an inductive element, a resistive element, a geometry of the sputtering chamber, or combinations thereof.

In some embodiments of the present disclosure, the tuning the impedance associated with the semiconductor substrate includes forming a positive self bias.

In some embodiments of the present disclosure, the tuning the impedance associated with the semiconductor substrate includes forming a DC bias of from about 35V to about 60V.

In some embodiments of the present disclosure, the method further includes (1) forming a dummy gate over the active region and the isolated region; (2) forming conductive regions in the active region by various implantation operations; and (3) removing the dummy gate by an etching operation.

In some embodiments of the present disclosure, the defining the active region on a semiconductor substrate includes a planarization operation to etch back as-deposited dielectric materials.

In some embodiments of the present disclosure, a ratio of a thinnest portion and a thickest portion of the work function metal layer is controlled to be greater than about 40%.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
an active region with a first surface;
an isolated region having a first top surface surrounding the active region, the first surface being higher than the first top surface;
a dielectric layer disposed over the first surface and an entirety of the first top surface of the isolated region;
a masking layer over a second top surface of the isolated region and in contact with the metal gate, the second top surface being higher than the first top surface; and
a metal gate having a plurality of metal layers, the plurality of metal layers disposed over the dielectric layer,
wherein a ratio of a thinnest portion and a thickest portion of at least one of the plurality of metal layers is greater than about 40%.

2. The semiconductor structure of claim 1, wherein the at least one of the plurality of metal layers is a work function metal layer.

3. The semiconductor structure of claim 1, wherein the thickest portion is over the first surface.

4. The semiconductor structure of claim 3, wherein the thinnest portion is at a corner connecting the first surface and the first top surface.

5. The semiconductor structure of claim 1, wherein the metal gate comprises Al metal layer.

6. The semiconductor structure of claim 1, further comprising a high k dielectric layer between the metal gate and the active region.

7. The semiconductor structure of claim 1, a height difference between the first surface and the first top surface being in a range of from about 9 nm to about 11 nm.

8. A field effect transistor (FET), comprising:
an active region surrounded by an isolated region, a sidewall and a first surface of the active region protruding from a second surface of the isolated region;
a dielectric layer disposed over the first surface and an entirety of the second surface of the isolated region;
a metal gate at least covering the sidewall and the first surface of the active region, and
a masking layer over a third surface of the isolated region and in contact with the metal gate, the third surface being higher than the second surface;
wherein an Al-containing layer of the metal gate comprises:
a first thickness in proximity to the first surface of the active region; and
a second thickness in proximity to a corner connecting the first surface and the sidewall of the active region, and
a thickness ratio of the second thickness and the first thickness is greater than about 40%.

9. The FET of claim 8, wherein the FET is an N-type FET.

10. The FET of claim 8, wherein the Al-containing layer comprises TiAl.

11. The FET of claim 8, further comprising a TiN layer between the Al-containing layer and the active region.

12. The FET of claim 8, wherein the second thickness is in a range of from about 1.5 nm to about 2 nm.

13. The FET of claim 8, wherein a length of the metal gate is substantially a length of the first surface, and a width of the metal gate is about 20 nm.

14. A semiconductor structure, comprising:
an active region with a first surface;
an isolated region having a second surface, surrounding the active region, the first surface being higher than the second surface;
a dielectric layer disposed over the first surface and an entirety of the second surface of the isolated region; and
a metal gate having a plurality of metal layers disposed over the dielectric layer, and
a masking layer over a third surface of the isolated region and in contact with the metal gate, the third surface being higher than the second surface,
wherein a ratio of a thinnest portion and a thickest portion of an aluminum barrier layer is greater than about 40%, the thickest portion being measured at the first surface, and the thinnest portion being measured at a corner connecting the first surface and the second surface.

15. The semiconductor structure of claim 14, further comprising a TiN layer between the aluminum barrier layer and the active region.

16. The semiconductor structure of claim 14, wherein the dielectric layer comprises a high k dielectric layer between the metal gate and the active region.

17. The semiconductor structure of claim 14, wherein the aluminum barrier layer comprises TiAl.

18. The semiconductor structure of claim 14, wherein the thinnest portion of the aluminum barrier layer is in a range of from about 1.5 nm to about 2 nm.

19. The semiconductor structure of claim 14, wherein the semiconductor structure is an N-type FET.

20. The semiconductor structure of claim 14, wherein a width of the metal gate is about 20 nm.

* * * * *